(12) United States Patent
Hiramine et al.

(10) Patent No.: US 9,543,810 B2
(45) Date of Patent: Jan. 10, 2017

(54) SEMICONDUCTOR MODULE AND DRIVER DEVICE

(71) Applicant: DENSO CORPORATION, Kariya, Aichi-pref. (JP)

(72) Inventors: Mikihiro Hiramine, Nagoya (JP); Toshihiro Fujita, Chita-gun (JP)

(73) Assignee: DENSO CORPORATION, Kariya (JP)

( * ) Notice: Subject to any disclaimer, the term of this patent is extended or adjusted under 35 U.S.C. 154(b) by 142 days.

(21) Appl. No.: 14/553,025

(22) Filed: Nov. 25, 2014

(65) Prior Publication Data
US 2015/0155762 A1 Jun. 4, 2015

(30) Foreign Application Priority Data

Nov. 29, 2013 (JP) ................................ 2013-247468

(51) Int. Cl.
| | | |
|---|---|---|
| *H02K 11/00* | (2016.01) | |
| *H02K 5/10* | (2006.01) | |
| *H02K 3/50* | (2006.01) | |
| *H01L 23/495* | (2006.01) | |
| *H02K 5/22* | (2006.01) | |
| *H01L 23/40* | (2006.01) | |

(52) U.S. Cl.
CPC ..... *H02K 11/0073* (2013.01); *H01L 23/49541* (2013.01); *H02K 3/50* (2013.01); *H02K 11/33* (2016.01); *H01L 23/4006* (2013.01); *H01L 23/49562* (2013.01); *H01L 23/49575* (2013.01); *H01L 2924/0002* (2013.01); *H02K 5/225* (2013.01)

(58) Field of Classification Search
CPC .............. H02K 5/22; H01R 11/00; H01B 5/00

USPC ............................... 310/68 A, 71, 68 D, 75 R
See application file for complete search history.

(56) References Cited

U.S. PATENT DOCUMENTS

2002/0043882 A1* 4/2002 Tanaka ................... H01R 11/12
310/71
2010/0327709 A1 12/2010 Minato et al.
(Continued)

FOREIGN PATENT DOCUMENTS

JP 2-120711 9/1990
JP H02120711 * 9/1990
(Continued)

OTHER PUBLICATIONS

Hiramine et al., U.S. Appl. No. 14/553,061, filed Nov. 25, 2014.
(Continued)

*Primary Examiner* — Jose Gonzalez Quinones
(74) *Attorney, Agent, or Firm* — Nixon & Vanderhye P.C.

(57) ABSTRACT

A semiconductor module includes a switching element, a molded body, and a motor terminal. The molded body having the switching element disposed therein. The motor terminal has a base portion and a connection portion having an insertion hole into which a motor wire is inserted and connected with the winding wire. The connection portion has a cutaway region that defines a slot. The winding wire of the motor and the semiconductor module are connected via the motor wire and the motor terminal, thereby reducing the number of components used for such connection compared with a connection that uses a connector, and achieving a volume reduction of the semiconductor module and a driver device using the same.

7 Claims, 11 Drawing Sheets

(56) References Cited

U.S. PATENT DOCUMENTS

| | | |
|---|---|---|
| 2012/0098366 A1 | 4/2012 | Yamasaki et al. |
| 2012/0098391 A1 | 4/2012 | Yamasaki et al. |
| 2012/0285266 A1 | 11/2012 | Takahashi et al. |
| 2012/0286604 A1 | 11/2012 | Abe et al. |

FOREIGN PATENT DOCUMENTS

| | | | |
|---|---|---|---|
| JP | 5-308754 | | 11/1993 |
| JP | 05308754 A | * | 11/1993 |
| JP | 2011030407 A | * | 2/2011 |
| JP | 2012-029448 | | 2/2012 |

OTHER PUBLICATIONS

Miyachi, U.S. Appl. No. 14/553,090, filed Nov. 25, 2014.
Matsuo et al., U.S. Appl. No. 14/553,121, filed Nov. 25, 2014.
Tsuboi, U.S. Appl. No. 14/553,170, filed Nov. 25, 2014.
Office Action (4 pages) dated Oct. 6, 2015, issued in corresponding Japanese Application No. 2013-247468 and English translation (4 pages).

* cited by examiner

SEMICONDUCTOR MODULE AND DRIVER DEVICE

CROSS REFERENCE TO RELATED APPLICATION

The present application is based on and claims the benefit of priority of Japanese Patent Application No. 2013-247468, filed on Nov. 29, 2013, the disclosure of which is incorporated herein by reference.

TECHNICAL FIELD

The present disclosure generally relates to a semiconductor module and a driver device using the same.

BACKGROUND INFORMATION

Generally, a driver device controls the drive of a motor by changing the switching ON and OFF of a switching element. The driver device includes a motor wire and a semiconductor module. For example, in a patent document 1 (i.e., Japanese Patent Laid-Open No. JP-2012-239294), the motor wire and the semiconductor module are electrically connected with a connector.

Since the connector is used as a connection between the motor wire and the semiconductor module in the patent document 1, the number of parts in the driver device increases, which may hinder the volume reduction of the driver device.

SUMMARY

It is an object of the present disclosure to provide a semiconductor module for connecting the motor wire with the semiconductor module, and a driver device using such a semiconductor module.

In an aspect of the present disclosure, the semiconductor module of the present disclosure includes a switching element, a molded body, and a motor terminal. The switching element switches an electric current supplied to a winding wire of a motor. The molded body having the switching element disposed therein. The motor terminal has a base portion and a connection portion. The base portion is formed to protrude from the molded body. The connection portion disposed on a tip side of the base portion and has an insertion hole into which a motor wire is inserted to be connected with the winding wire.

The connection portion has a cutaway region that defines a slot, and the slot is connected to the insertion hole and expands outwardly from the insertion hole. In other words, the slot extends from the insertion hole to make one continuous space in the motor terminal. Put another way, the slot is connected to the insertion hole.

Also, in the present disclosure, the slot is formed on the connection portion in a non-overlapping relationship with a stress line along which a stress is applied to a connection position of the motor wire and the motor terminal.

Further, in the present disclosure, the slot has a first sidewall and a second sidewall, the first sidewall formed on a base portion side of the slot and the second sidewall formed on a side of the slot that is opposite to the base portion side. A tip on the second sidewall points toward the base portion side of the slot relative to a center of the insertion hole.

Additionally, in the present disclosure, when the motor wire has a rectangular cross section, a shortest width of the slot is shorter than a shortest side of the rectangular cross section of the motor wire.

Still further, in the present disclosure, when the motor wire has a round cross section, a shortest width of the slot is shorter than a diameter of the round cross section of the motor wire.

Moreover, in the present disclosure, the semiconductor module also includes a plurality of motor terminals. When one motor terminal is longer than an other motor terminal, a shortest width of the slot on the one motor terminal is longer than a shortest width of the slot on the other motor terminal.

Yet further, in the present disclosure, the motor terminal is connected to the motor wire by inserting the motor wire into the insertion hole and filling the insertion hole with a filler member, the insertion hole has a minimum filler line that is set according to a shape of the motor terminal, and the insertion hole is filled until the filler member reaches the minimum filler line.

Even further, in the present disclosure, a driver device includes a motor unit, and a control unit disposed on one axial side of the motor and having a heat sink on which a semiconductor module is fastened. The semiconductor module includes a switching element, a molded body, and a motor terminal. The switching element switches an electric current supplied to a winding wire of a motor. The molded body having the switching element disposed therein. The motor terminal has a base portion and a connection portion. The base portion is formed to protrude from the molded body. The connection portion disposed on a tip side of the base portion and has an insertion hole into which a motor wire is inserted to be connected with the winding wire.

The connection portion has a cutaway region that defines a slot, and the slot is connected to the insertion hole and expands outwardly from the insertion hole.

In the present disclosure, since a connection between the winding wire of the motor and the semiconductor module is made possible by the motor wire and the motor terminal, the number of parts used in such connection is reduced compared with a structure using a connector, enabling a volume reduction of the driver device.

Further, when performing a dipping process which dips a tip of the motor terminal in a coating material, e.g. in a melted solder, the slot breaks the surface tension of the coating material (i.e., a liquid, or a melted solder) in the course of pulling lifting the motor terminal therefrom, and cutting of the surface tension of the coating material is beneficial and an advantage because the coating material, which may otherwise remain in the insertion hole, is removed therefrom even when the size of the insertion hole is small. That is, a "coating material remaining in the hole" defect is prevented by devising such a structure.

BRIEF DESCRIPTION OF THE DRAWINGS

Objects, features, and advantages of the present disclosure will become more apparent from the following detailed description made with reference to the accompanying drawings, in which.

DETAILED DESCRIPTION

The semiconductor module according to the present disclosure and the driver device using the same are described base on the drawings. Hereafter in the following embodiments, like parts have like numbers and redundant description is not provided. Note that FIGS. 1-14 are all drawn for illustrative purposes.

First Embodiment

Figure 1:
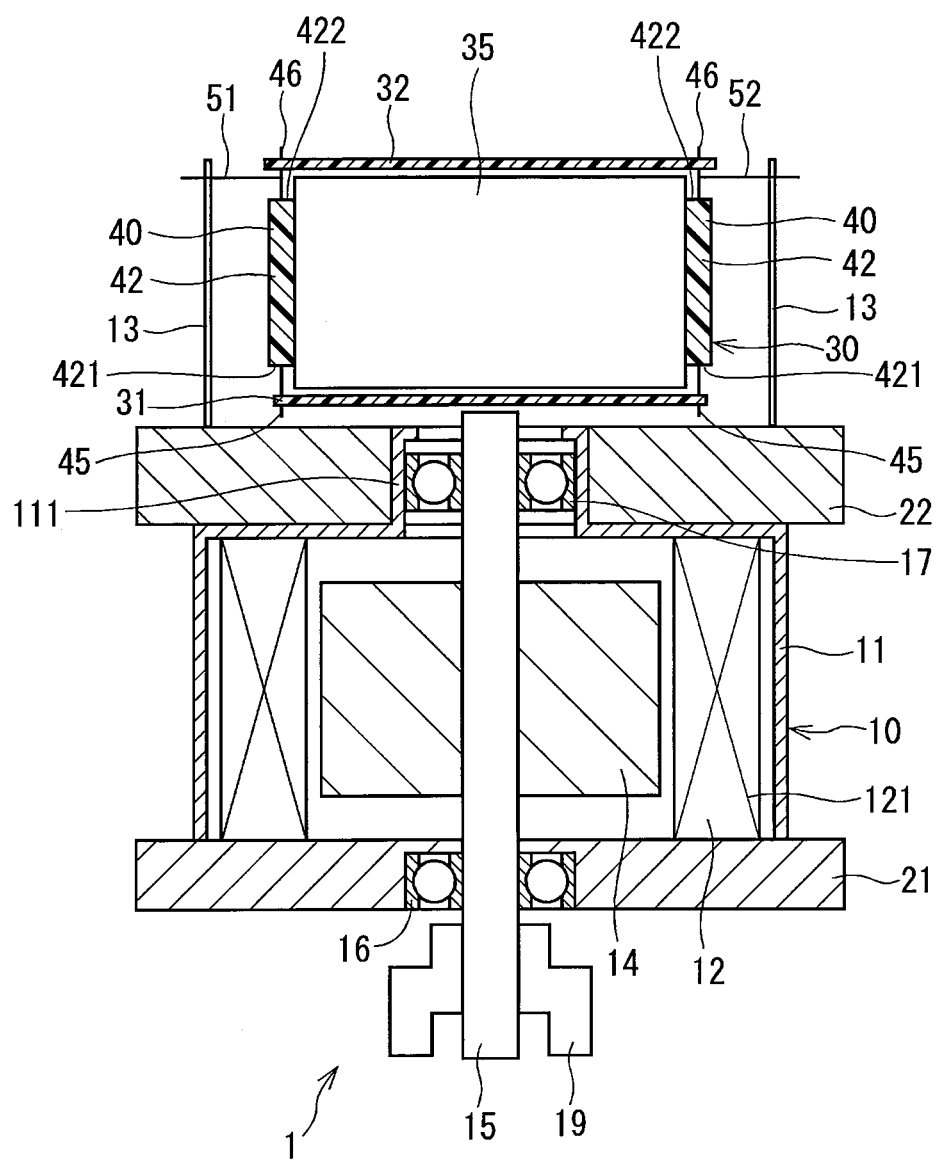
FIG. 1 is a sectional view of a driver device by a first embodiment of the present disclosure.

As shown in FIG. 1, a semiconductor module 40 in the first embodiment of the present disclosure is applied to a driver device 1. The driver device 1 is used in an electric power steering device of vehicles, for example. The driver device 1 has a motor 10 and a control unit 30. The driver device 1 of the present embodiment has a one-body construction in which the control unit 30 is disposed on one axial side of the motor 10 along a motor axis relative to the motor 10.

The motor 10 includes a motor case 11, a stator 12, a rotor 14, a shaft 15, a first frame 21, a second frame 22 and the like. The motor 10 in the present embodiment is a three-phase brush-less motor.

The motor case 11 is formed substantially in a cylinder shape, for example, by a soft magnetism material, such as iron.

The stator 12 has a winding wire 121 wound on a stator core that is fixedly disposed in an inside of the motor case 11. The winding wire 121 constitutes a three-phase circuit winding which consists of a U phase coil, a V phase coil, and a W phase coil. In the present embodiment, the winding wire 121 constitutes 2 sets of three-phase circuit winding. From the winding wire 121, a motor wire 13 is taken out to extend toward a control unit 30, and the motor wire 13 is connected to the semiconductor module 40.

The rotor 14 is rotatably disposed in a radial inside of the stator 12 so that the rotor 14 and the stator 12 share the same axis. The rotor 14 is formed substantially in a cylinder shape, and a permanent magnet is stuck on an outer peripheral surface so that an N pole and an S pole alternate.

The shaft 15 is formed by metallic material, for example, and is fixedly disposed on an axial center of the rotor 14. The shaft 15 is rotatably supported by bearings 16 and 17. Therefore, the shaft 15 rotates together with the rotor 14.

The bearings 16 and 17 are ball bearings. The bearing 16 is fixedly disposed on a first frame 21. The bearing 17 is fixedly disposed on a bearing supporter 111 formed on a control unit 30 side of the motor case 11.

The shaft 15 has a joint 19 disposed on an opposite end that is opposite to the end on a control unit 30 side. The joint 19 outputs a rotation of the rotor 14 and the shaft 15 to an external device via an engagement with a gear etc. which is not illustrated. The shaft 15 has a non-illustrated magnet disposed on an opposite end that is opposite to the end on a control unit 30 side.

The first frame 21 is formed substantially in a circular table shape, and is disposed to cover one end of the motor case 11 which is opposite to the control unit 30. Substantially at the center of the first frame, the bearing 16 is fixedly disposed.

The second frame 22 is formed substantially in a circular table shape, and is disposed on a control unit 30 side of the motor case 11.

The control unit 30 has a controller board 31, a power board 32, a heat sink 35, the semiconductor module 40 and the like.

The controller board 31 is fixedly disposed on one side of the heat sink 35, on a side close to the motor 10. The controller board 31 has controller-type electronic components of comparatively small electric current, such as a microcomputer and a Hall IC, implemented thereon. Further, at a position on the controller board 31 facing the magnet on the shaft 15, a rotation angle sensor for detecting rotation of the rotor 14 and the shaft 15 is disposed.

The power board 32 has power-regulation-type electronic components of comparatively large electric current, such as a capacitor, a choke coil, etc. implemented thereon, and the power board 32 is fixedly disposed on an opposite side of the heat sink 35 relative to the motor 10.

The heat sink 35 is made from thermally conductive materials, e.g. aluminum or the like, and the heat sink 35 is fixedly disposed on the second frame 22 by a screw or the like, with the controller board 31, the power board 32, and the semiconductor module 40 attached thereon.

Figure 2:
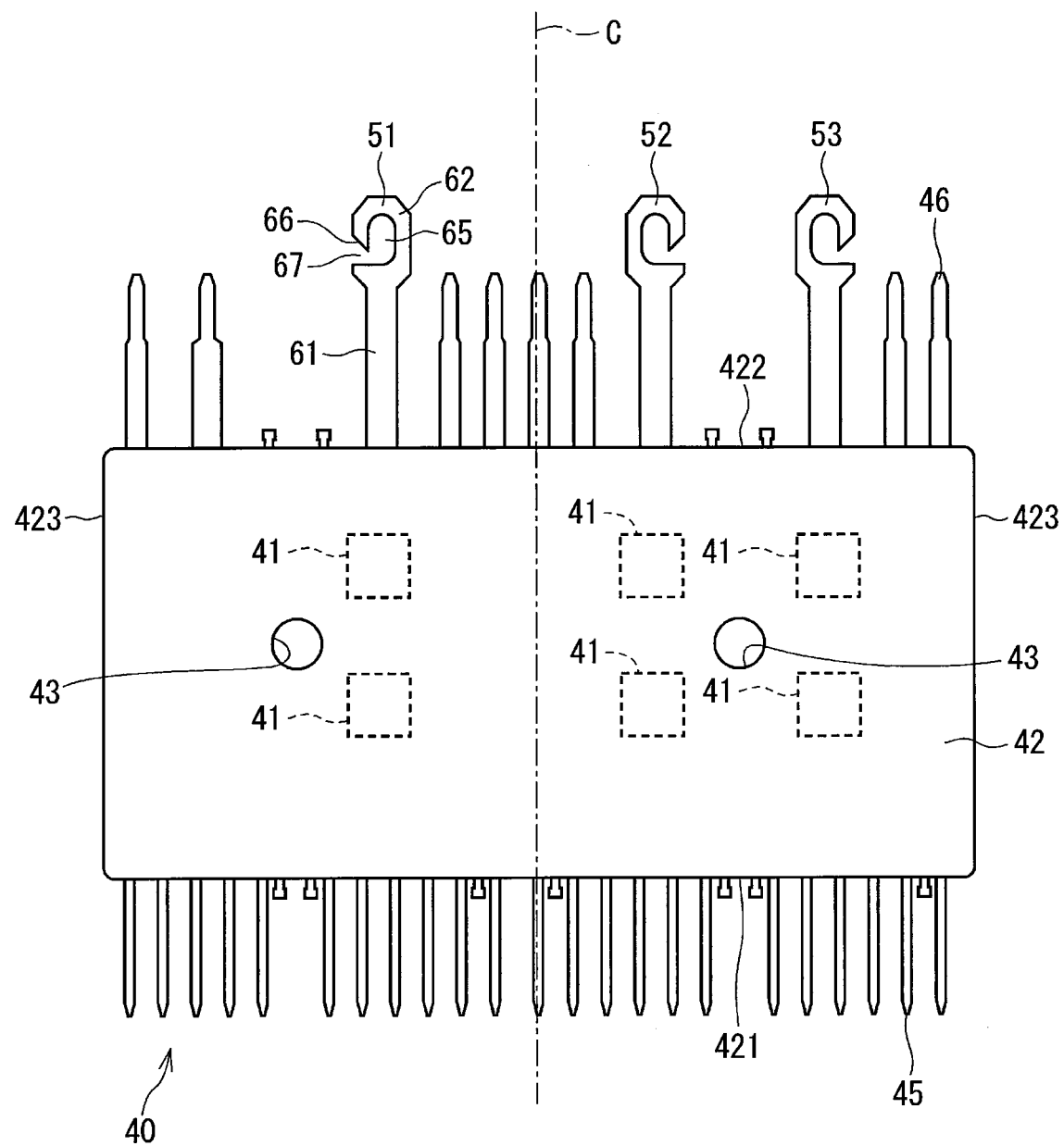
FIG. 2 is a plan view of a semiconductor module by the first embodiment of the present disclosure.

As shown in FIG. 2, the semiconductor module 40 has a switching element 41, a molded body 42, a control terminal 45, a power terminal 46, and motor terminals 51, 52, and 53.

The switching element 41 switches a supply of electric current to each of many phases of the winding wire 121. Six switching elements 41 which constitute one inverter are mounted on a lead frame (not illustrated) which is made from electrical conductive material, such as a copper plate etc.

The molded body 42 molds the six switching elements 41 in one body to provide one inverter. In other words, the molded body (42) has the switching element disposed therein, which are together formed as a single body. In the molded body 42, a tapped hole 43 for inserting in the screw for fixing the semiconductor module 40 to the heat sink 35 is formed.

As shown in FIG. 1, the semiconductor module 40 is arranged so that a broad face of the molded body 42 extends along the heat sink 35. Here, one face of the molded body 42 which faces the motor 10 is designated as a first face 421, and the other face of the molded body 42 facing away from the motor 10 is designated as a second face 422.

The motor 10 in the present embodiment uses two sets of inverter for its drive, two semiconductor modules 40 are arranged on both sides of the heat sink 35 as shown in FIG. 1. A heat radiation sheet which is not illustrated interposes the molded body 42 and the heat sink 35, and the semiconductor module 40 is fixedly disposed on the heat sink 35 with a screw or the like.

Returning to FIG. 2, the control terminal 45 protrudes from the first face 421 of the molded body 42. The power terminal 46 protrudes from the second face 422 of the molded body 42. The semiconductor module 40 is fixedly disposed on the heat sink 35 so that the first face 421 faces the controller board 31 and the second face 422 faces the power board 32, and the control terminal 45 is connected to the controller board 31 and the power terminal 46 is connected to the power board 32.

The motor terminals 51, 52, and 53 are made from the same material as the lead frame, and nickel plating is performed thereon. The motor terminals 51, 52, and 53 protrude from the second face 422. That is, the motor terminal 51 protrudes away from the motor 10. In the present embodiment, the motor terminals 51, 52, and 53 are provided in three pieces, respectively corresponding to the three phases of the winding wire 121.

As shown in FIG. 1, the motor terminals 51, 52, 53 are bent away from the heat sink 35, and are connected to the motor wire 13. The bending direction of the motor terminals 51, 52, 53 in FIG. 2 are a rising direction rising from a surface of the drawing. The motor wire 13 extends from the motor 10 at least up to the second face 422 at a radial outside of the semiconductor module 40 in the driver device 1. Space is provided between the motor wire 13 and the molded body 42 for isolation, so that the motor wire 13 and the semiconductor module 40 do not contact with each other at a position other than the motor terminal 51.

Other than the right-left reversed orientation, the motor terminal 51 and the motor terminals 52 and 53 have the same shape. Therefore, in the following, the motor terminal 51 is described to represent all other motor terminals.

Figure 3:
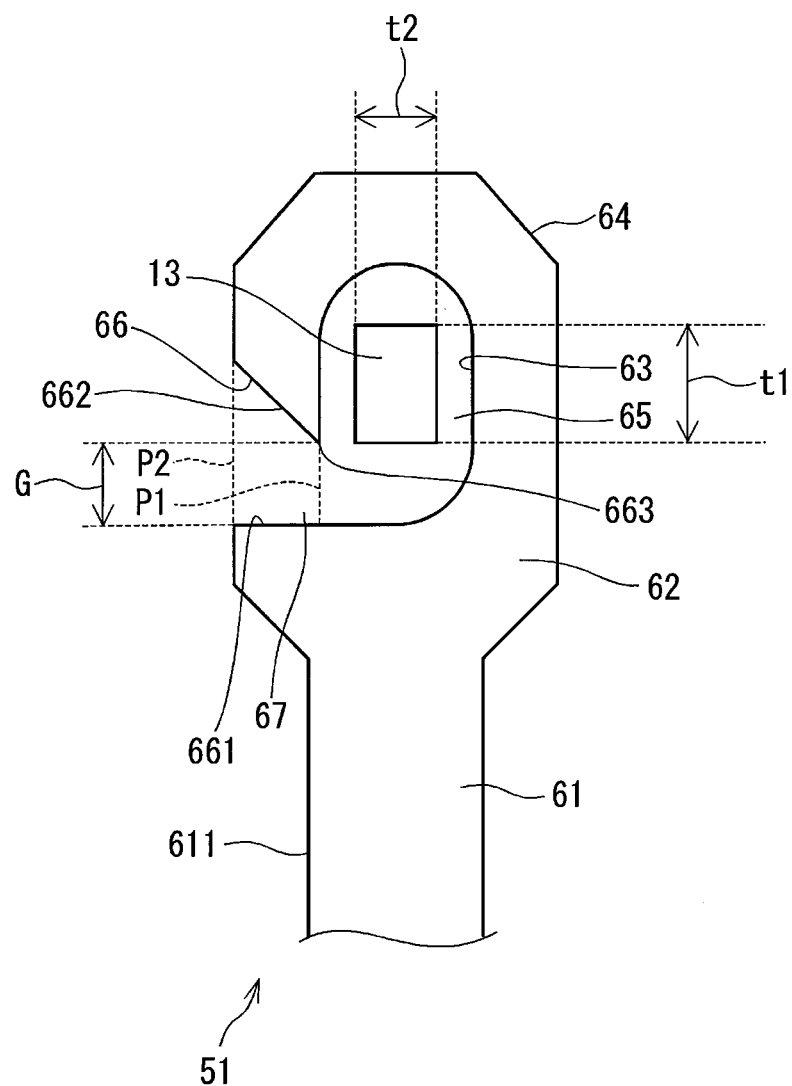
FIG. 3 is a plan view of the motor terminal by the first embodiment of the present disclosure.

As shown in FIG. 3, the motor terminal 51 has a base portion 61 and a connection portion 62.

The base portion 61 protrudes from the molded body 42.

The connection portion 62 formed at a tip of the base portion 61 is formed in a shape of a ring substantially, and has an inner peripheral wall 63 and an outer peripheral wall 64. On an inside of the inner peripheral wall 63, an insertion hole 65 in which the motor wire 13 is inserted is formed. The insertion hole 65 is a space defined by the inner peripheral wall 63 as well as a virtual surface P1 which is an extension of the inner peripheral wall 63. The insertion hole 65 of the present embodiment is formed substantially in an elliptical shape.

Further, the connection portion 62 has a cutaway region 66. The cutaway region 66 comprises a base side cutaway region face 661 serving as a first cutaway region face and a tip side cutaway region face 662 serving as a second cutaway region face. When (i) an extending direction of the motor terminal 51 that extends from the molded body 42 is defined as a longitudinal direction (i.e., an up-down direction of paper surface having FIG. 3 drawn thereon) and (ii) a direction perpendicular thereto is defined as a width direction (i.e., a right-left direction of paper surface having FIG. 3 drawn thereon), the cutaway region 66 is formed on one side of the connection portion 62 in the width direction. Furthermore, when (i) a center line C of the second face 422 is defined as an "inside" and (ii) a side face 423 of the molded body 42 is defined as an "outside," the cutaway region 66 is formed on the outside of the connection portion 62 (see FIG. 2). The base side cutaway region face 661 may correspond to the first sidewall in the claims.

By having the cutaway region 66, a slot 67 is formed. The slot 67 is a space defined by the base side cutaway region face 661, the tip side cutaway region face 662, the virtual surface P1 that is an extension of the inner peripheral wall 63, and a virtual surface P2 that is an extension of the outer peripheral wall 64, and the slot 67 is formed as a continuously extending space of the insertion hole 65. Further, the slot is connected to the insertion hole and expands outwardly from the insertion hole.

The base side cutaway region face 661 formed in the base portion 61 of the cutaway region 66 extends from a base portion 61 side end of the insertion hole 65 substantially in parallel with the second face 422 of the molded body 42. The tip side cutaway region face 662 formed on the tip side of the cutaway region 66 is formed as a slanted face, which is connected to the outer peripheral wall 64 on the tip side and is connected to the inner peripheral wall 63 on the base portion 61 side, an angle between the tip side cutaway region face 662 and the inner peripheral wall 63 is an acute angle. Further, a tip 663 of the tip side cutaway region face 662 on an insertion hole 65 side is positioned on the base portion 61 side relative to the center of the insertion hole 65. In other words, a tip 663 of the tip side cutaway region face 662 points toward the base portion 61 side of the slot relative to the center of the insertion hole 65. As a result, the connection portion 62 may have a hook-like shape. The tip side cutaway region face 662 may correspond to the second sidewall in the claims.

In the present embodiment, the motor wire 13 inserted in the insertion hole 65 is a square/rectangular wire, i.e., having a substantially rectangle cross section, and, when the dimension of the motor wire 13 is defined as a long side having a length t1 and a short side having a length t2, a gap distance G between (i) the tip 663 of the tip side cutaway region face 662 and (ii) the base side cutaway region face 661 is formed to be smaller than the length t2 of the short side. In other words, when the motor wire 13 has a rectangular cross section, a shortest width of the slot is shorter than a shortest side of the rectangular cross section of the motor wire. By devising such a structure, the motor wire 13 is prevented from being pulled off from the slot 67. Gap distance G may be referred to as "width" in the claims.

Figure 4:
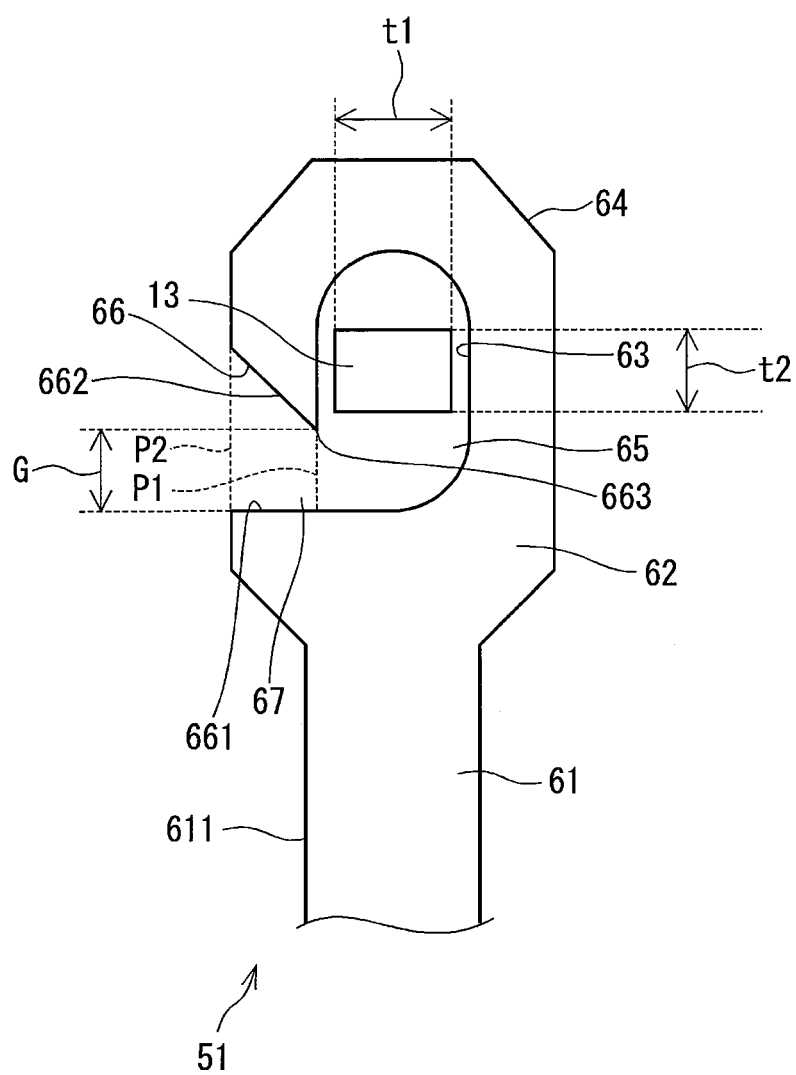
FIG. 4 is a plan view of the motor terminal by the first embodiment of the present disclosure.

Further, the positioning of the motor wire 13 may be different from the one in FIG. 3, in which the long side of the wire 13 is substantially in parallel with the long side (i.e., an up-down direction in FIGS. 3, 4) of the insertion hole 65 and the short side of the wire 13 is substantially in parallel with the short side of the insertion hole 65 (i.e., a right-left direction in FIGS. 3, 4). That is, for example, the long side of the wire 13 is substantially in parallel with the short side of the insertion hole 65 (i.e., a right-left direction in FIGS. 3, 4) and the short side of the wire 13 is substantially in parallel with the long side of the insertion hole 65 (i.e., an up-down direction in FIGS. 3, 4), as shown in FIG. 4. In other words, the motor wire 13 may be arbitrarily positioned in the insertion hole 65.

Figure 5:
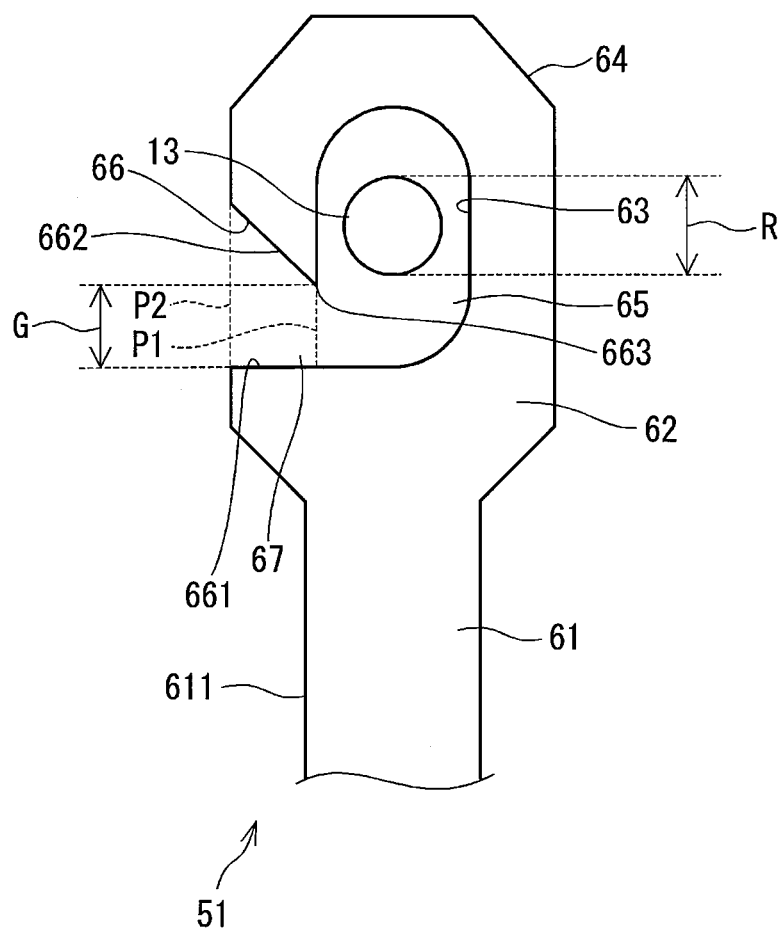
FIG. 5 is a plan view of the motor terminal by the first embodiment of the present disclosure.

When the cross section of the motor wire 13 substantially has a round shape as shown in FIG. 5, assuming that the motor wire 13 has a diameter R, the gap distance G is formed to be smaller than the diameter R of the motor wire 13. In other words, when the motor wire has a round cross section, a shortest width gap distance of the notching slot is shorter than a diameter of a the round cross section of the motor wire when the motor wire is a round wire. By devising such a structure, the motor wire 13 is prevented from being pulled off from the slot 67.

Further, when (i) the minimum distance between the base side cutaway region face 661 and the tip side cutaway region face 662 is set to the gap distance G and (ii) such a gap distance G is adjusted to be smaller than the short side or the diameter R of the motor wire 13, the motor wire 13 is prevented from being pulled off from the slot 67.

Figure 6:
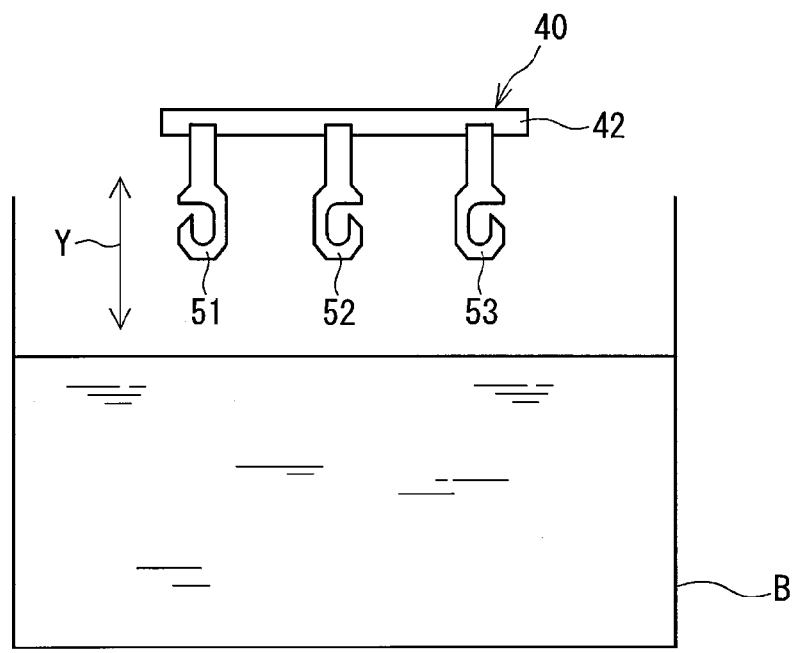
FIG. 6 is an illustration of the motor terminal in a solder dipping state where the motor terminal of the first embodiment of the present disclosure is immersed in a dip of melted solder.

In the present embodiment, the tip of the motor terminals 51, 52, and 53 is dipped in a melted solder, i.e., undergoes a solder dipping process. As shown in FIG. 6, by moving up and down of the semiconductor module 40 along a both-sided arrow Y, the tip of each of the motor terminals 51, 52, and 53 that are respectively in a bent state is dipped in a melted solder bath B, for the solder dipping process. By such processing, solder dipping process is performed on the connection portion 62 and on a part of the base portion 61, wettability with the solder used for connection between the motor wire 13 and the motor terminals 51, 52, and 53 improves, and connectivity therebetween is improved. Further, oxidization of the connection portion 62 is controlled and conservability thereof improves.

In the present embodiment, the slot 67 is formed as a continuous space of the insertion hole 65. Therefore, when the motor terminals 51, 52, 53 are lifted from the melted solder bath B, the surface tension is broken by the slot 67 in the course of lifting therefrom. Therefore, the solder remaining fault, i.e., a problem caused by the solder remaining in the insertion hole 65 which prevents or makes it difficult for the motor wire 13 to be inserted therein, is prevented. Further, the slot 67 is positioned on the base portion 61 side relative to the center of the insertion hole 65. Therefore, the slot 67 comes out from the melted solder bath B before the coming out of the insertion hole 65 in the course of lifting the motor terminals 51, 52, 53, which makes it easier to cut/break the surface tension of the melted solder. Especially, in the present embodiment, the tip 663 of the tip side cutaway region face 662 having an acute angle contributes the cutting of the surface tension, facilitating the prevention of the above-described fault. Further, as long as the motor wire 13 is insertable into the insertion hole 65, a nominal amount of the solder remaining in the slot 67 is allowed.

Figure 7:
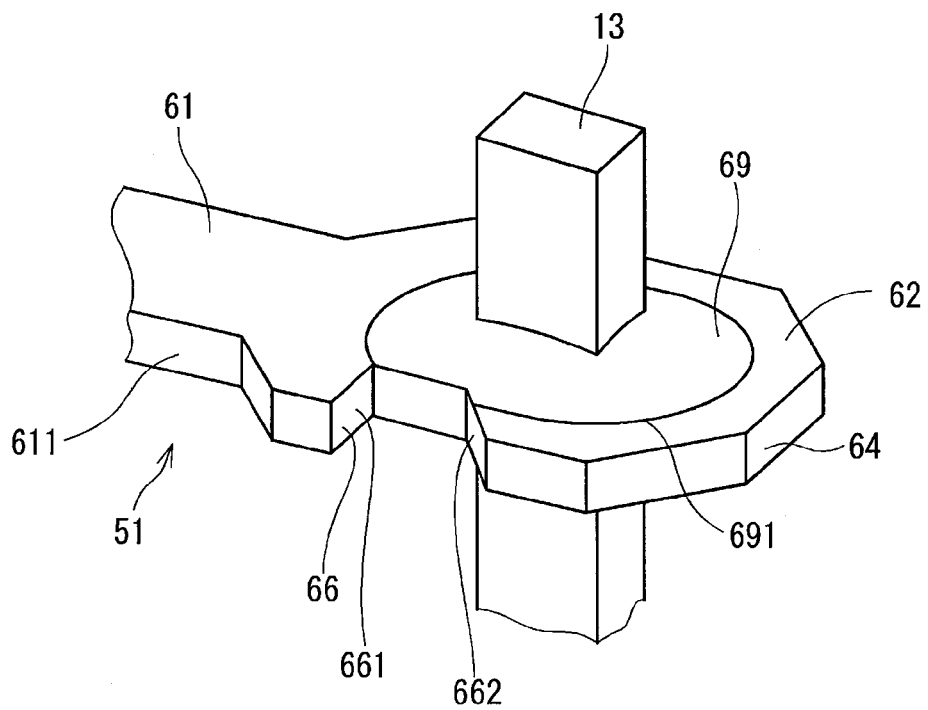
FIG. 7 is a perspective view of a connected state of the motor terminal and a motor wire where the motor terminal and the motor wire of the first embodiment of the present disclosure are connected to each other.
Figure 8:
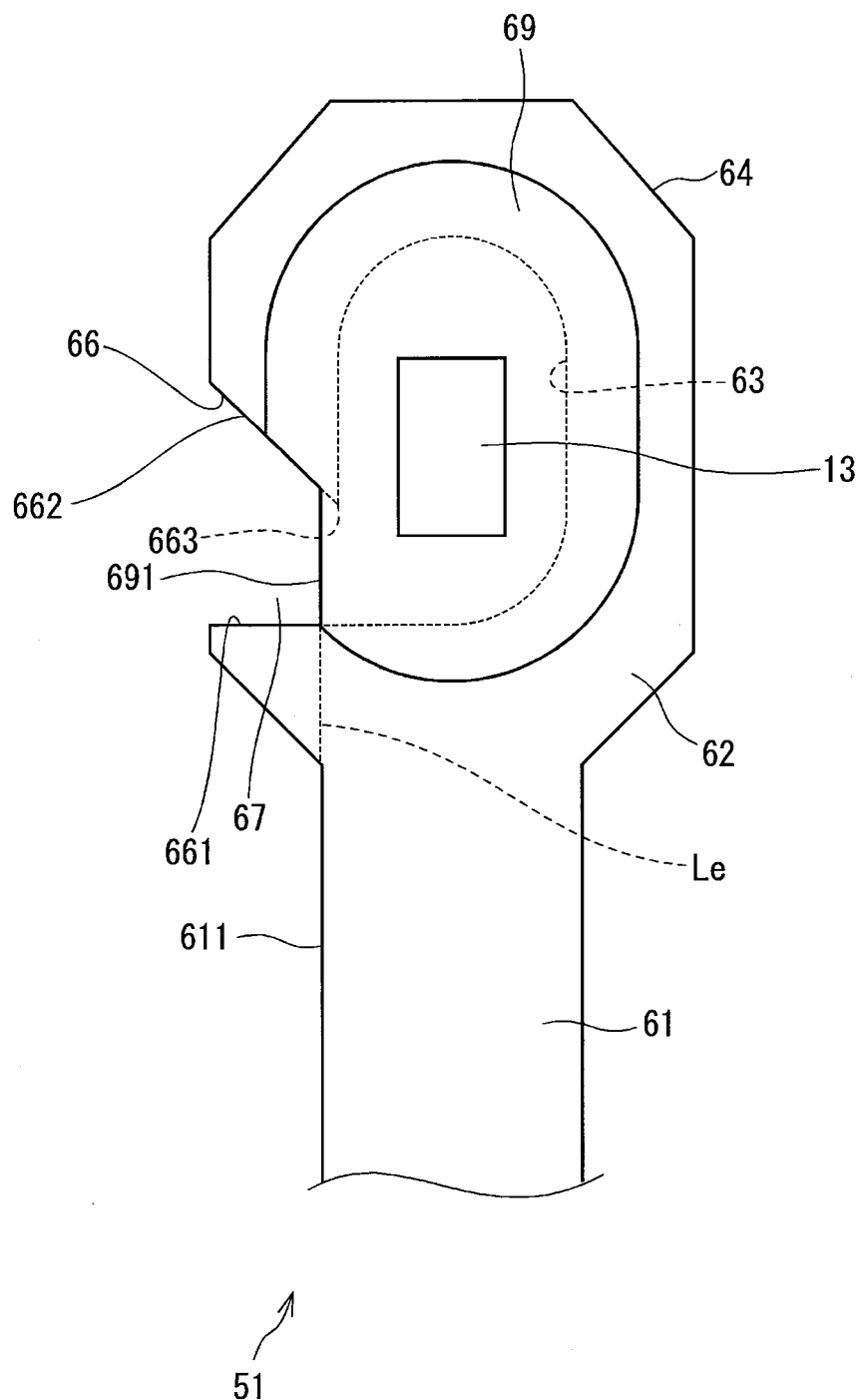
FIG. 8 is a plan view of the connected state where the motor terminal and the motor wire of the first embodiment of the present disclosure are connected.

As shown in FIGS. 7 and 8, the motor wire 13 and the motor terminal 51 are connected by a solder part 69 that serves as a filler member/material. The solder part 69 fills the insertion hole 65 at least up to a minimum filler line that is defined as a virtual line Le, i.e., an extension of a side wall 611 of the base portion 61. That is, the solder part 69 fills the space to have an outer periphery 691 of the solder part 69 positioned on an outside of the virtual line Le. By devising such a structure, the motor wire 13 and the motor terminal 51 are securely connected.

In the present embodiment, the motor terminal 51 of the semiconductor module 40 fixedly disposed on the heat sink 35 that is made from aluminum or the like and the motor wire 13 extending from the motor case 11 that is made from iron or the like are connected. Since the heat sink 35 and the motor case 11 are made from respectively different materials that have respectively different linear expansion coefficients, a difference of which causes a thermal stress that applies a stress to the connection position between the motor wire 13 and the motor terminal 51, i.e., the stress along a diameter direction of the driver device 1.

Figure 9:
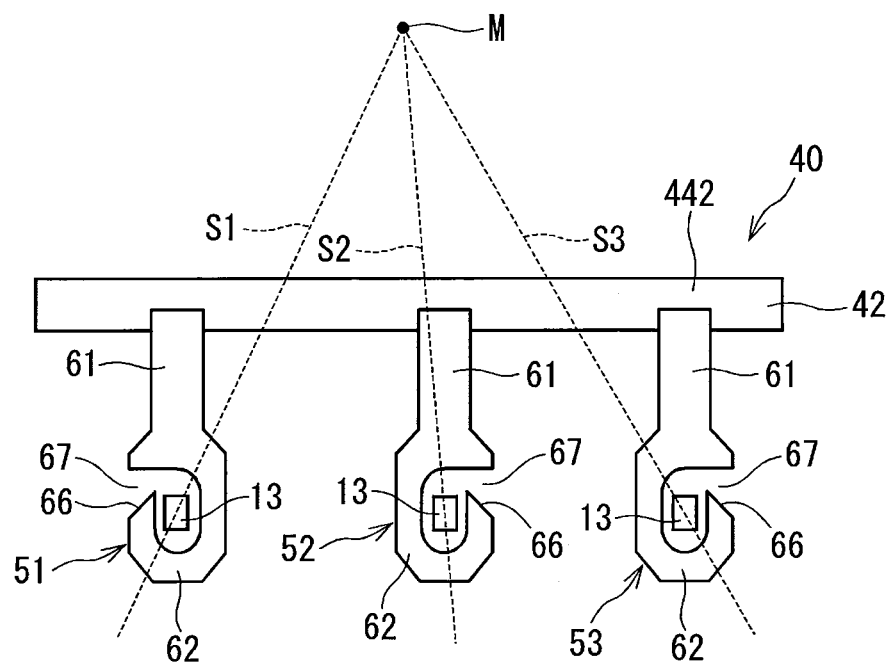
FIG. 9 is an illustration of a stress applied state of a semiconductor module of the first embodiment of the present disclosure.

As shown in FIG. 9, a stress is applied to the connection position between the motor wire 13 and the motor terminal 51 along stress lines S1-S3, which are connecting lines between an axial center M of the driver device 1 and the center of each of the motor wires 13, due to the difference between a linear expansion coefficient of the heat sink 35 and a linear expansion coefficient of the motor case 11. When the semiconductor module 40 is taken out as a separate component, a stress applied to each of the connection positions is caused along the "diagonal" stress lines S1-S3 that are tilted toward a center line C that defines a center of the long side of the molded body 42. Further, when the slot 67 is formed on the motor terminal 51, the connection strength between the motor line 13 and the motor terminal 51 may be weaker at a position of the slot 67 than other positions, i.e., relative to non-slotted portions of the connection position.

However, in the present embodiment, the cutaway region 66 is formed to have the slot 67 at a position that is away from the stress line (i.e., in non-overlapping relationship with the stress line) along which the stress is applied to the connection position between the motor wire 13 and the motor terminal 51. Further, when the semiconductor module 40 is taken out as a separate component, the slot 67 is formed to face toward an "outside" of the long side of the molded body 42. By devising such a structure, the slot 67 having a relatively weak connection strength is positioned away from the stress line, or positioned away from a direct application of the stress, that is, swaying the stress at a "smaller-stress" position. That is, by not exposing the slot 67 to the stress weakening of the connection strength between the motor wire 13 and the motor terminal 51 is prevented.

As described in full detail above, the semiconductor module 40 of the present embodiment has the switching element 41, the molded body 42, and the motor terminals 51, 52, and 53. The switching element 41 switches the electric current supplied to the winding wire 121 of the motor 10. The molded body 42 molds the switching element 41. In other words, the molded body (42) has the switching element disposed therein. The motor terminals 51, 52, and 53 have the base portion 61 and the connection portion 62. The base portion 61 protrudes from the molded body 42. The connection portion 62 is formed on the tip side of the base portion 61, and has the insertion hole 65 in which the motor wire 13 connected to the winding wire 121 is inserted. The connection portion 62 has the cutaway region 66 which defines the slot 67 as a continuous space of the insertion hole 65 outside of the insertion hole 65.

In the present embodiment, the winding wire 121 of the motor 10 and the semiconductor module 40 are connected via the motor wire 13 and the motor terminal 51, thereby reducing the number of components used for such connection compared with a connection that uses a connector, and thereby achieving a volume reduction of the module 40 and the apparatus 1.

Further, when performing dipping process which dips the tip of the motor terminal 51 in a bath of coating materials, e.g. melted solder, the slot 67 cuts the surface tension of the of the coating material that may "clog" the insertion hole 65 in the course of lifting of the dipped part (i.e., the motor terminal 51) from the melted solder bath B. By devising such a structure, even when the size of the insertion hole 65 is small, the solder-left-in-the-hole fault is prevented from happening. Further, the solder dipping process prevents oxidization of the connection portion 62, thereby improving the conservability of the connection portion 62.

The cutaway region 66 is formed away from the stress lines S1-S3 along which the stress is applied to the connection position between the motor wire 13 and the motor terminal 51. The slot 67 constituted by having the cutaway region 66 is formed at a position that has a weaker connection strength than other portion(s) of the connection position. Therefore, by forming the slot 67 away from the stress lines S1-S3, a stress to both of the motor wire 13 and the solder part 69 is swayed (i.e., pushed or pulled) even when the motor wire 13 may be moved along the radius of the motor 10 due to the thermal stress, thereby preventing the connection fault at the connection position between the motor wire 13 and the motor terminal 51.

The cutaway region 66 has (i) the base side cutaway region face 661 which is a face on a base portion 61 side of the terminal 51 and (ii) the tip side cutaway region face 662 which is a face on a tip side of the terminal 51. The tip 663 of the tip side cutaway region face 662 is formed on a base portion 61 side relative to the center of the insertion hole 65. By devising such a structure, when the motor terminal 51 is lifted from the melted solder bath B, the surface tension of the solder in the insertion hole 65 is broken with ease.

The gap distance G of the slot 67 is smaller than the length t2 of the short side of the cross section of the motor wire 13, when the motor wire 13 is a square/rectangular wire.

The gap distance G of the slot 67 is smaller than the diameter R of the cross section of the motor wire 13, when the motor wire 13 is a round wire.

By devising such a structure, assembleability of the motor wire 13 improves because the motor wire 13 does not escape from the slot 67.

The motor terminal 51 is electrically connected to the motor wire 13 by a filling up of the solder part 69 into the insertion hole 65 when the motor wire 13 is inserted therein.

The solder part 69 filling up the insertion hole 65 takes a following shape, that is, an outer periphery of the solder part 69 positioned at least on the minimum filler line that is set according to the shape of the motor terminal 51. The minimum filler line of the present embodiment is set as the virtual line Le which is an extension of the side wall 611 of the base portion 61. By devising such a structure, while the motor wire 13 and the motor terminal 51 are securely connected, whether a connection state of the solder part 69 is in a good shape or not is effectively confirmed in an assembly/manufacturing process.

The driver device 1 has the motor 10 and the control unit 30. The control unit 30 has the semiconductor module 40 and the heat sink 35 in which the semiconductor module 40 is fixedly disposed. The control unit 30 is disposed on one axial side of the motor 10 along the motor axis.

By devising such a structure, the volume of the driver device 1 as a whole is reduced. Further, a stress is applied to the connection position between the motor wire 13 and the motor terminal 51 when the motor case 11 defining an outer shape of the motor 10 and the heat sink 35 are made from the respectively different materials, i.e., materials having respectively different linear expansion coefficients. In the present embodiment, the slot 67 is formed at a position that is away from the stress lines, thereby structurally preventing the thermal stress from causing the connection fault.

Second Embodiment

Figure 10:
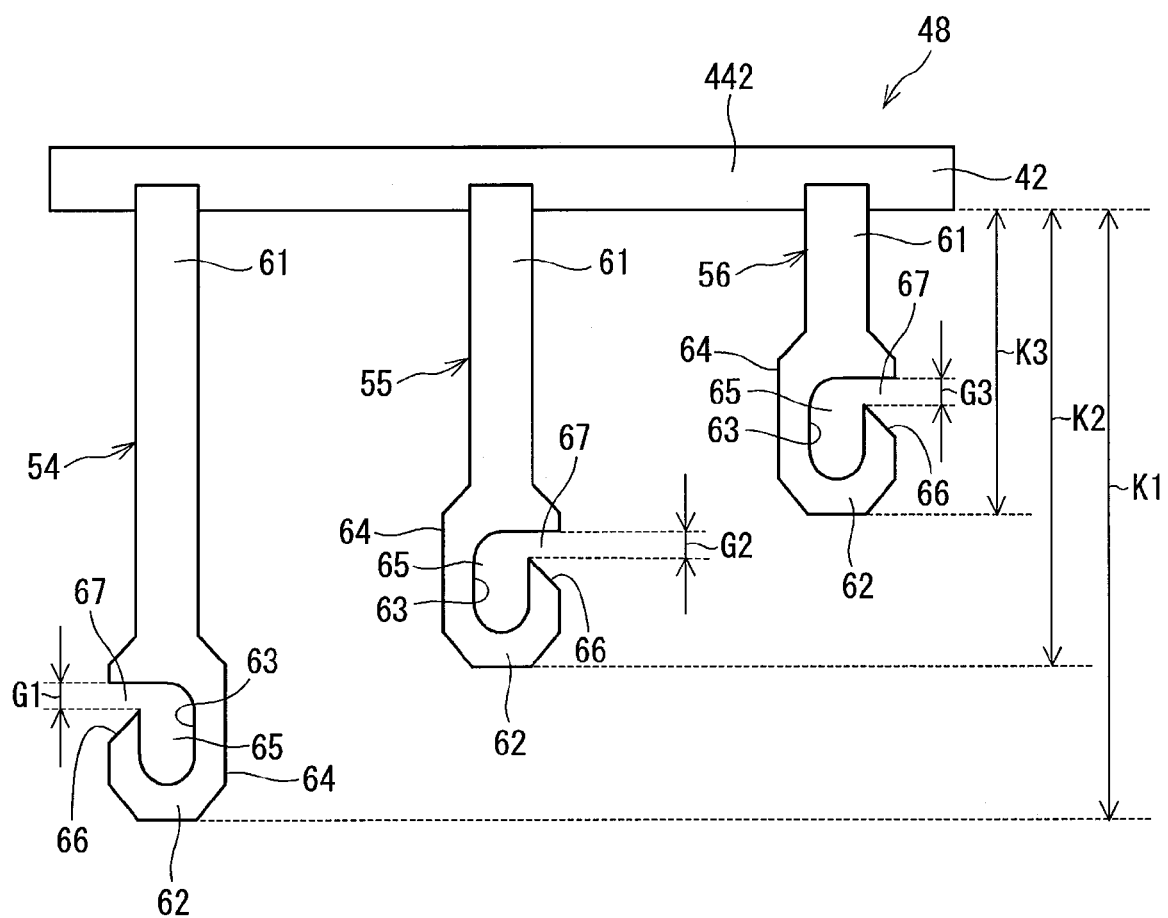
FIG. 10 is an illustration of the semiconductor module of a second embodiment of the present disclosure.
Figure 11:
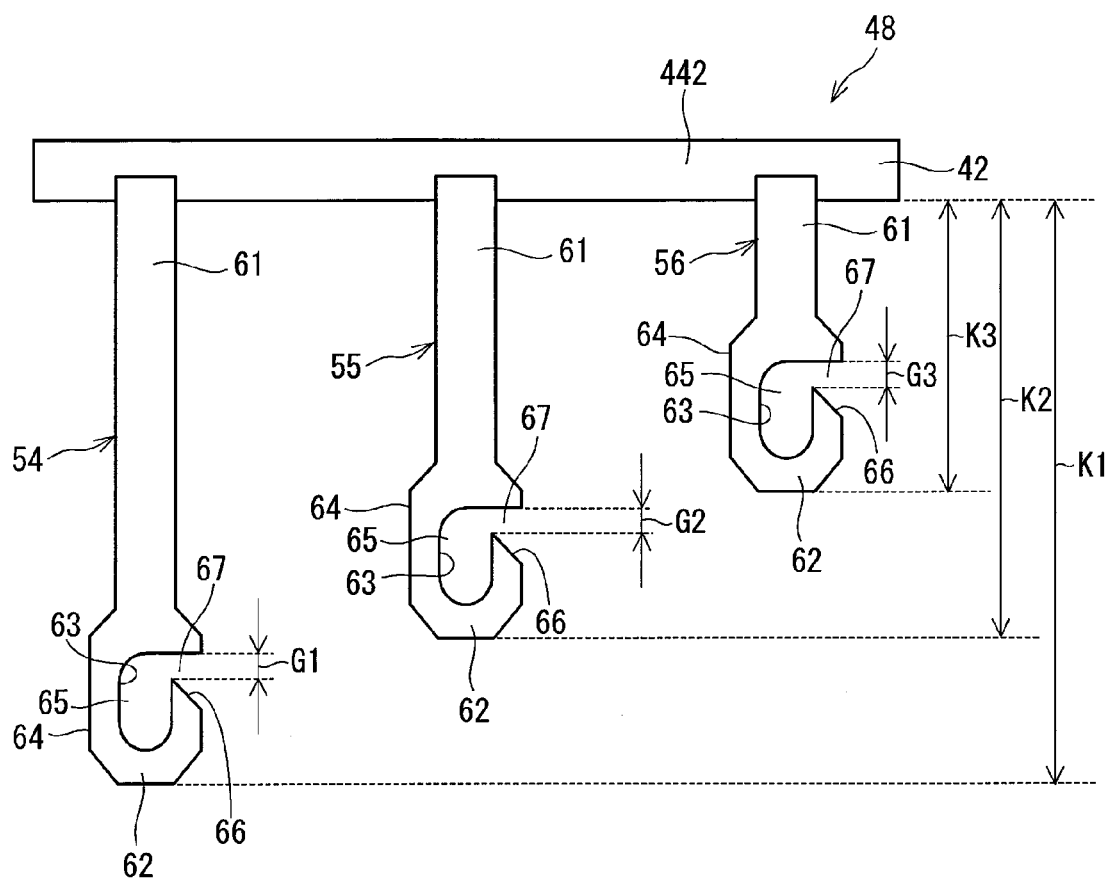
FIG. 11 is a mimetic diagram showing the semiconductor module of the second embodiment of the present disclosure.

The semiconductor module in the second embodiment of the present disclosure is shown in FIGS. 10 and 11. FIGS. 10 and 11 correspond to FIG. 9 of the first embodiment. A semiconductor module 48 of the present embodiment has three motor terminals 54, 55, and 56. The motor terminals 54, 55, and 56 are the same as that of the first embodiment, except that the length of the base portion 61 and the gap distance of the slot 67 differ from the one in the first embodiment. Since the length of the base portion 61 differs from the one in the first embodiment, the entire length of each of the motor terminals 54, 55, and 56 differs from the length of the motor terminal in the first embodiment. Further, in FIG. 11, one of the three terminals, i.e., the motor terminal 54 is reversed from the one in FIG. 10. Other than that, the configuration in FIG. 11 is the same as the configuration in FIG. 10.

Here, the motor terminal 54 is defined as having a length K1, the motor terminal 55 is defined as having a length K2, and the motor terminal 56 is defined as having a length K3. Further, the slot 67 on the motor terminal 54 has a gap distance G1, the slot 67 on the motor terminal 55 has a gap distance G2, and the slot 67 on the motor terminal 56 has a gap distance G3.

As shown in FIGS. 10 and 11, the motor terminal 54 is longer than the motor terminals 55 and 56, and the motor terminal 55 is longer than the motor terminal 56. That is, a relationship K1>K2>K3 is observed.

Assuming that the motor terminals 54, 55, and 56 are immersed in the melted solder bath B (see FIG. 6) and are lifted therefrom with the molded body 42 substantially held to be level, the connection portion 62 will be taken out from the melted solder bath B in an order of the motor terminals 56, 55, and 54. That is, the longer the length of the motor terminal is, the longer the time immersed in the melted solder bath B, thereby being lift from the from melted solder B later. Thus, in the present embodiment, the gap distances of the slot 67 are configured to fulfill the following relationship G1>G2>G3. In other words, when one motor terminal is longer than an other motor terminal, a shortest gap distance of the slot on the one motor terminal is longer than a shortest gap distance of the slot on the other motor terminal. That is, the cutting of the surface tension is made easier by providing a greater gap distance for the motor terminal that is dipped in the melted solder bath B for a longer time.

In the present embodiment, the motor terminals 54, 55, and 56 are provided in plural pieces. Further, the gap distance G1 in the motor terminal 54 having the length K1 is formed to be greater than the gap distance G2 in the motor terminal 55 having the length K2 that is shorter than the length K1, and is also formed to be greater than the gap distance G3 in the motor terminal 56 having the length K3 that is shorter than length K1. In this case, the length K1 of the motor terminal 54 is a "first length," and the length K2 of the motor terminal 55 and the length K3 of the motor terminal 56 are a "second length." Further, the gap distance G2 in the motor terminal 55 having the length K2 is formed to be greater than the gap distance G3 in the motor terminal 56 having the length K3 that is shorter than the length K2. In this case, the length K2 of the motor terminal 55 is a "first length," and the length K3 of the motor terminal 56 is a "second length."

By devising such a structure, according to the difference of the lift timings from the melted solder bath B due to the difference in the lengths of the motor terminals 54, 55, and 56, the surface tension is appropriately broken.

Further, the same effects as the above-mentioned embodiment are also achieved.

Third Embodiment

The cutaway region shape in the third to fifth embodiments is different from the one in the first embodiment. Therefore, such a difference of the cutaway region shape is mainly described hereafter.

Figure 12:
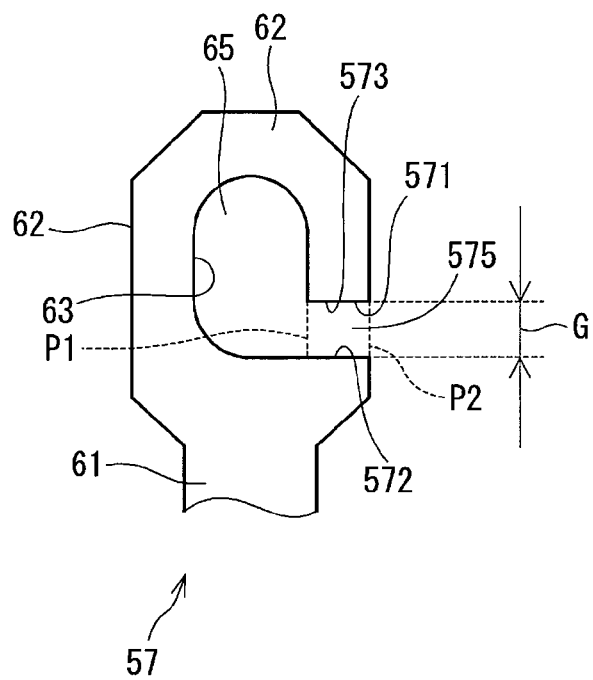
FIG. 12 is a plan view of the motor terminal of a third embodiment of the present disclosure.

As shown in FIG. 12, a cutaway region 571 of a motor terminal 57 in the third embodiment of the present disclosure has a base side cutaway region face 572 serving as a first cutaway region face and a tip side cutaway region face 573 serving as a second cutaway region face, and forms a slot 575. The slot 575 is formed on one side in a width direction of the connection portion 62. The tip side cutaway region face 573 of the present embodiment is formed substantially in parallel with the base side cutaway region face 572. By forming the tip side the cutaway region face 573 and the base side cutaway region face 572 substantially in parallel with each other, the connectivity of the motor terminal 57 and the solder part 69 improves compared with a case in which the tip side cutaway region face 573 is tilted. The same effects as the above-mentioned embodiments are also achieved. The base side cutaway region face 572 may correspond to the first sidewall in the claims. The tip side cutaway region face 573 may correspond to the second sidewall in the claims.

Fourth Embodiment

Figure 13:
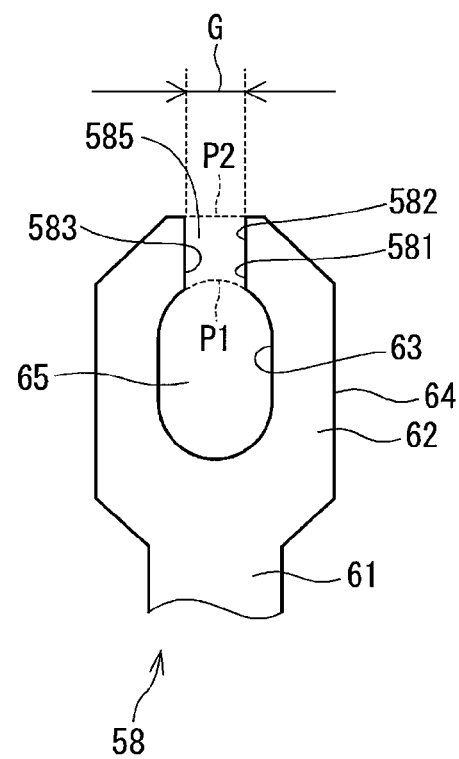
FIG. 13 is a plan view of the motor terminal of a fourth embodiment of the present disclosure.

As shown in FIG. 13, a cutaway region 581 of a motor terminal 58 in the fourth embodiment of the present disclosure is formed at a tip of the connection portion 62, and forms a slot 585. Cutaway region faces 582 and 583 which constitute the cutaway region 581 are formed substantially in parallel with each other. In the present embodiment, the cutaway region faces 582 and 583 are a "first cutaway region face" and a "second cutaway region face" respectively.

In the present embodiment, since the slot 585 is formed on the tip side (of the motor terminal 58), the motor terminal 58 and the solder part 69 are securely connected on a base portion 61 side of the insertion hole 65. By devising such a structure, even when a stress and a vibration are applied thereto, the faulty connection of the motor wire 13 and the motor terminal 58 will not easily be caused.

Further, the same effects as the above-mentioned embodiments are also achieved.

Fifth Embodiment

Figure 14:
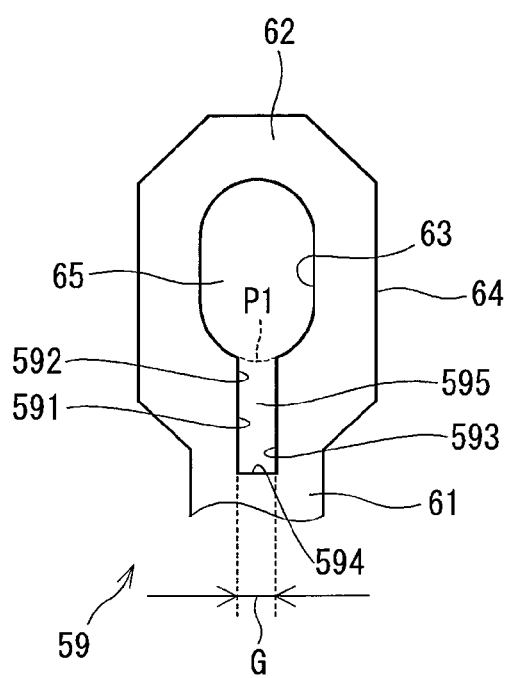
FIG. 14 is a plan view of the motor terminal of a fifth embodiment of the present disclosure.

As shown in FIG. 14, a cutaway region 591 of a motor terminal 59 in the fifth embodiment of the present disclosure is formed on a base portion 61 side of the connection portion 62, and forms a slot 595. The cutaway region faces 592 and 593 which constitute the cutaway region 591 are formed substantially in parallel with each other. The slot 595 of the present embodiment is a space defined by the cutaway region faces 592, 593, a bottom face 594 of the cutaway region 591, an inner peripheral wall 63 and a virtual surface P1 which is an extension of the inner peripheral wall 63. In the present embodiment, the cutaway region faces 592 and 593 are a "first cutaway region face" and a "second cutaway region face" respectively.

In the present embodiment, the slot 595 is formed on a base portion 61 side of the connection portion 62, and the slot 595 does not have an opening on an outer periphery of the motor terminal 59. Therefore, there is no chance for the motor wire 13 to be pulled off or escape from the motor terminal 59, and thereby improving assembleability thereof.

Further, the same effects as the above-mentioned embodiment are also achieved.

Other Embodiments (a) According to the above-mentioned embodiments, three motor terminals are provided in a semiconductor module. According to the other embodiments, the number of the motor terminals provided in a semiconductor module may be not only three but also in any number. Further, as long as the slot is formed in the connector portion, the base portion and the connection portion of the motor terminal may respectively take any shape. For example, just like the motor terminal 54 shown in FIG. 11, the slot may be formed on one side in the width direction, i.e., facing an "inside" of the semiconductor module. Further, the motor terminals may have respectively different shapes in one semiconductor module.

(b) According to the above-described second embodiment, the gap distance is greater when the motor terminal is longer. According to the other embodiments, the gap distance may be set to the same value regardless of the length of the motor terminals, or the gap distance may be set to be shorter when the motor terminal is longer.

(c) The semiconductor module of the above-described embodiments has the six switching elements molded in one body. In the other embodiments, the number of switching elements may be not only six but in any number. Further, in addition to the switching element, various electronic components such as relays of various kinds, e.g., a power relay, a motor relay, etc. a shunt resistor, and the like may also be molded in one body.

(d) According to the above-mentioned embodiments, the semiconductor module is applied to the driver device. However, the semiconductor module may be used for other apparatus. The driver device may be applied to any device other than the electric power steering device.

Although the present disclosure has been fully described in connection with preferred embodiment thereof with reference to the accompanying drawings, it is to be noted that various switches and modifications will become apparent to those skilled in the art, and such switches, modifications, and summarized schemes are to be understood as being within the scope of the present disclosure as defined by appended claims.

What is claimed is:

1. A semiconductor module comprising:
a switching element switching an electric current supplied to a winding wire of a motor;
a molded body having the switching element disposed therein; and
a motor terminal having a base portion and a connection portion, the base portion protruding from the molded body, and the connection portion disposed on a tip side of the base portion and having an insertion hole into which a motor wire is inserted to be connected with the winding wire, wherein
the connection portion has a cutaway region that defines a slot, and the slot is connected to the insertion hole and expands outwardly from the insertion hole, wherein
the slot has a first sidewall and a second sidewall, the first sidewall is formed on a base portion side of the slot and the second sidewall is formed on a side of the slot that is opposite to the base portion side, and a tip on the second sidewall points toward the base portion side of the slot relative to a center of the insertion hole.

2. The semiconductor module of claim 1, wherein the slot is formed on the connection portion in a non-overlapping relationship with a stress line along which a stress is applied to a connection position of the motor wire and the motor terminal.

3. The semiconductor module of claim 1, wherein when the motor wire has a rectangular cross section, a shortest width of the slot is shorter than a shortest side of the rectangular cross section of the motor wire.

4. The semiconductor module of claim 1, wherein when the motor wire has a round cross section, a shortest width of the slot is shorter than a diameter of the round cross section of the motor wire.

5. The semiconductor module of claim 1, further comprising:
a plurality of motor terminals, wherein
when one motor terminal is longer than an other motor terminal, a shortest width of the slot on the one motor terminal is longer than a shortest width of the slot on the other motor terminal.

6. The semiconductor module of claim 1, wherein the motor terminal is connected to the motor wire by inserting the motor wire into the insertion hole and filling the insertion hole with a filler member,
the insertion hole has a minimum filler line that is set according to a shape of the motor terminal, and the insertion hole is filled until the filler member reaches the minimum filler line.

7. A driver device comprising:
a motor unit; and
a control unit disposed on one axial side of the motor and having a heat sink on which a semiconductor module is fastened, the semiconductor module including
a switching element switching an electric current supplied to a winding wire of a motor,
a molded body having the switching element disposed therein, and
a motor terminal having a base portion and a connection portion, the base portion protruding from the molded body, and the connection portion disposed on a tip side of the base portion and having an insertion hole into which a motor wire is inserted to be connected with the winding wire, wherein
the connection portion has a cutaway region that defines a slot, the slot is connected to the insertion hole and expands outwardly from the insertion hole,
the slot has a first sidewall and a second sidewall, the first sidewall is formed on a base portion side of the slot and the second sidewall is formed on a side of the slot that is opposite to the base portion side, and
a tip on the second sidewall points toward the base portion side of the slot relative to a center of the insertion hole.

\* \* \* \* \*